(12) United States Patent
Pandey et al.

(10) Patent No.: US 12,176,427 B2
(45) Date of Patent: Dec. 24, 2024

(54) BIPOLAR TRANSISTOR AND GATE STRUCTURE ON SEMICONDUCTOR FIN AND METHODS TO FORM SAME

(71) Applicant: GlobalFoundries U.S. Inc., Malta, NY (US)

(72) Inventors: Shesh Mani Pandey, Saratoga Springs, NY (US); Vibhor Jain, Clifton Park, NY (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 240 days.

(21) Appl. No.: 17/931,938

(22) Filed: Sep. 14, 2022

(65) Prior Publication Data

US 2024/0088272 A1    Mar. 14, 2024

(51) Int. Cl.
*H01L 29/735*    (2006.01)
*H01L 29/08*    (2006.01)
(Continued)

(52) U.S. Cl.
CPC ........ *H01L 29/735* (2013.01); *H01L 29/0808* (2013.01); *H01L 29/0821* (2013.01); *H01L 29/1008* (2013.01); *H01L 29/6625* (2013.01)

(58) Field of Classification Search
CPC . H01L 29/732; H01L 29/063; H01L 29/6656; H01L 29/735; H01L 29/737; H01L 29/0673; H01L 29/0808; H01L 29/0821; H01L 29/1008; H01L 29/161; H01L 29/0847; H01L 29/2003; H01L 29/205; H01L 29/207; H01L 29/6625; H01L 29/66242; H01L 29/66439; H01L 29/66484; H01L 29/66886; H01L 29/7831; H01L 29/7832; H01L 29/78645; H01L 29/78648; H01L 29/775; H01L 29/78696; H01L 29/42392; H01L 29/36; H01L 27/0259; H01L 27/0229; H01L 27/0274; H01L 27/0277; H01L 27/0623; H01L 27/0647; H01L 27/067; H01L 27/0288;
(Continued)

(56) References Cited

U.S. PATENT DOCUMENTS

| 4,567,645 A | 2/1986 | Cavanagh et al. |
| 6,569,730 B2 | 5/2003 | Tsai et al. |

(Continued)

OTHER PUBLICATIONS

U.S. Appl. No. 17/644,939 Final Office Action dated Aug. 25, 2023, 25 pages.

(Continued)

*Primary Examiner* — Natalia A Gondarenko
(74) *Attorney, Agent, or Firm* — Francois Pagette; Hoffman Warnick LLC

(57) ABSTRACT

Embodiments of the disclosure provide a bipolar transistor and gate structure on a semiconductor fin and methods to form the same. A structure according to the disclosure includes a semiconductor fin including an intrinsic base region and an extrinsic base region adjacent the intrinsic base region along a length of the semiconductor fin. Sidewalls of the intrinsic base region of the semiconductor fin are adjacent an emitter and a collector along a width of the semiconductor fin. A gate structure is on the semiconductor fin and between the intrinsic base region and the extrinsic base region.

18 Claims, 10 Drawing Sheets

(51) Int. Cl.
H01L 29/10 (2006.01)
H01L 29/66 (2006.01)

(58) Field of Classification Search
CPC ............... H01L 27/0722; H01L 27/075; H01L 27/0783; H01L 21/02532; H01L 21/0254; H01L 21/02546; H01L 21/02595; H01L 21/26513; H01L 21/26546; H01L 21/26586; H01L 21/30612; H01L 21/3081; H01L 21/6835; H01L 21/8222; H01L 21/8248; H01L 21/8249; H01L 21/84; H01L 29/42304; H01L 29/402; H01L 29/0649
USPC ....... 257/586, 565, 526, 306, 355, 133, 141, 257/197, 368
See application file for complete search history.

(56) References Cited

U.S. PATENT DOCUMENTS

| | | | |
|---|---|---|---|
| 7,485,537 | B2 | 2/2009 | Ho et al. |
| 7,977,752 | B2 * | 7/2011 | Kawachi ............. H01L 27/1214 257/370 |
| 8,258,602 | B2 * | 9/2012 | Ke ........................ H01L 29/73 257/E29.174 |
| 8,703,571 | B2 | 4/2014 | Ke et al. |
| 9,209,095 | B2 | 12/2015 | Chang et al. |
| 9,514,998 | B1 | 12/2016 | Basker et al. |
| 9,673,307 | B1 | 6/2017 | Chan |
| 10,217,853 | B1 | 2/2019 | Pan |
| 10,468,498 | B2 | 11/2019 | Kim et al. |
| 10,741,645 | B2 | 8/2020 | Balakrishnan et al. |
| 2011/0147892 | A1 | 6/2011 | Chiu et al. |
| 2013/0328162 | A1 | 12/2013 | Hu et al. |
| 2014/0367745 | A1 | 12/2014 | Cheng et al. |
| 2015/0287650 | A1 | 10/2015 | Chang et al. |
| 2017/0062564 | A1 | 3/2017 | Zhou |
| 2018/0269289 | A1 * | 9/2018 | Balakrishnan ........ H01L 29/735 |
| 2019/0312126 | A1 | 10/2019 | Shiu |
| 2021/0091180 | A1 | 3/2021 | Pekarik et al. |
| 2021/0134987 | A1 * | 5/2021 | Yang ................... H01L 29/0657 |
| 2021/0193836 | A1 | 6/2021 | Guha et al. |
| 2021/0296309 | A1 | 9/2021 | Chang et al. |
| 2023/0062013 | A1 | 3/2023 | Holt et al. |
| 2023/0098557 | A1 | 3/2023 | Yu et al. |

OTHER PUBLICATIONS

European Search Report for corresponding EP Application No. 22198237 dated Jan. 16, 2023, 10 pages.
U.S. Appl. No. 17/644,939, filed Dec. 17, 2021, 145 pages.
U.S. Appl. No. 17/644,939, Restriction Requirement dated May 12, 2023, 6 pages.
U.S. Appl. No. 17/644,939, Response to Restriction Requirement filed Dec. 17, 2021, 7 pages.
U.S. Appl. No. 17/644,939, Office Action dated Jun. 20, 2023, 29 pages.
U.S. Appl. No. 17/644,939, Amendment to Office Action filed Jun. 29, 2023, 13 pages.
U.S. Appl. No. 17/578,687, Office Action dated Mar. 16, 2023, 23 pages.
U.S. Appl. No. 17/578,687, Response to Office Action filed Jun. 16, 2023, 9 pages.
U.S. Appl. No. 17/578,687, Notice of Allowance dated Jul. 11, 2023, 9 pages.
U.S. Appl. No. 63/239,135, filed Aug. 31, 2021, 31 pages.
U.S. Appl. No. 63/261,791, filed Sep. 29, 2021, 47 pages.
Application_Aug. 31, 2021.
Application_Sep. 29, 2021.

* cited by examiner

BIPOLAR TRANSISTOR AND GATE STRUCTURE ON SEMICONDUCTOR FIN AND METHODS TO FORM SAME

BACKGROUND

1. Technical Field

The present disclosure provides a bipolar transistor and gate structure on a semiconductor fin and methods to form the same.

2. Background Art

Present technology is at atomic level scaling of certain micro-devices such as logic gates, bipolar transistors, field effect transistors (FETs), and capacitors. Circuit chips with millions of such devices are common. The structure of a lateral bipolar transistor defines several of its properties during operation. Conventional integrated circuits may employ vertical bipolar transistors or silicon germanium (SiGe) bipolar transistors, but these types of devices may have higher costs and/or operational parameters that do not meet certain constraints.

SUMMARY

All aspects, examples and features mentioned herein can be combined in any technically possible way.

Embodiments of the disclosure provide a structure including: a semiconductor fin including an intrinsic base region and an extrinsic base region adjacent the intrinsic base region along a length of the semiconductor fin; a collector adjacent a first sidewall of the intrinsic base region along a width of the semiconductor fin; an emitter adjacent a second sidewall of the intrinsic base region along the width of the semiconductor fin; and a gate structure on the semiconductor fin, and between the intrinsic base region and the extrinsic base region.

Other embodiments of the disclosure provide a structure including: a semiconductor fin over a substrate, the semiconductor fin including: an intrinsic base region within a first portion of the semiconductor fin, and an extrinsic base region within a second portion of the semiconductor fin; an emitter adjacent a first sidewall of the intrinsic base region of the semiconductor fin along a width of the semiconductor fin; a collector adjacent a second sidewall of the intrinsic base region of the semiconductor fin along the width of the semiconductor fin, wherein the intrinsic base region of the semiconductor fin is horizontally between the emitter and the collector; a gate structure on the semiconductor fin; a gate contact to the gate structure; and a base contact to the extrinsic base region of the semiconductor fin, wherein the base contact is coupled to the gate contact.

Additional embodiments of the disclosure provide a method including: forming a semiconductor fin including an intrinsic base region and an extrinsic base region adjacent the intrinsic base region along a length of the semiconductor fin; forming a bipolar transistor including the intrinsic base region of the semiconductor fin horizontally between an emitter and a collector along a width of the semiconductor fin; and forming a gate structure on the semiconductor fin, and between the intrinsic base region and the extrinsic base region.

Another aspect of the disclosure includes any of the preceding aspects, and further including forming a dielectric block over the intrinsic base region of the semiconductor fin, and horizontally between the emitter and the collector.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
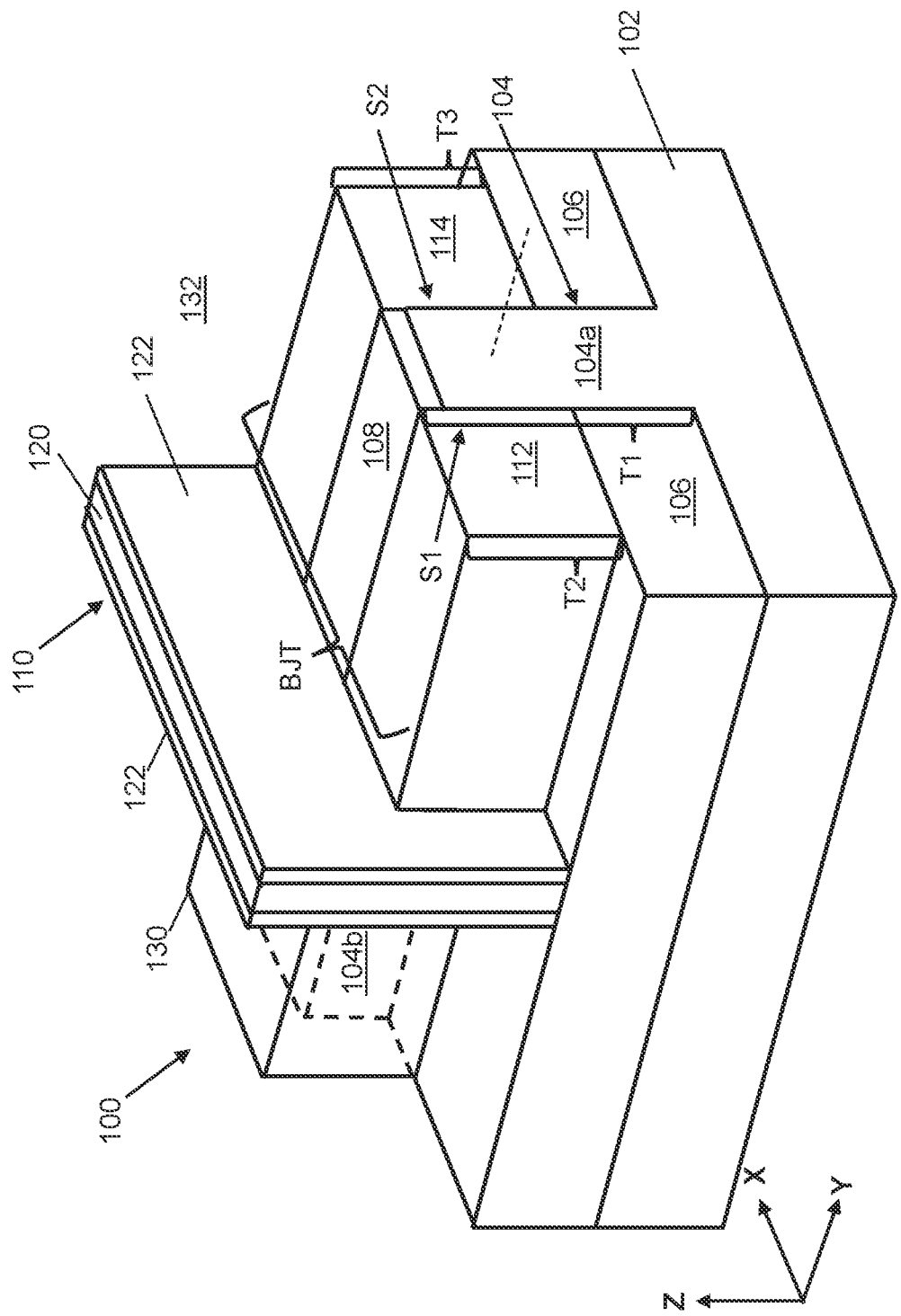
FIG. 1 shows a partial perspective view of a structure according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a bipolar transistor and gate structure on a semiconductor fin and methods to form the same. A structure according to the disclosure includes a semiconductor fin including an intrinsic base region and an extrinsic base region adjacent the intrinsic base region along a length of the semiconductor fin. A bipolar transistor of the structure includes the intrinsic base region of the semiconductor fin horizontally between an emitter and a collector along a width of the semiconductor fin. A gate structure is on the semiconductor fin and between the intrinsic base region and the extrinsic base region. During operation, other electrical elements can selectively bias the gate to control electrical resistance through the base of the bipolar transistor. The presence of dielectric material (s) between the gate structure and bipolar transistor may prevent voltage biasing of the gate from interfering with the operation of the bipolar transistor.

Bipolar junction transistor (BJT) structures, such as those in embodiments of the disclosure, operate using multiple "P-N junctions." The term "P-N" refers to two adjacent materials having different types of conductivity (i.e., P-type and N-type), which may be induced through dopants within the adjacent material(s). A P-N junction, when formed in a device, may operate as a diode. A diode is a two-terminal element, which behaves differently from conductive or insulative materials between two points of electrical contact. Specifically, a diode provides high conductivity from one contact to the other in one voltage bias direction (i.e., the "forward" direction), but provides little to no conductivity in the opposite direction (i.e., the "reverse" direction). In the case of the P-N junction, the orientation of a diode's forward and reverse directions may be contingent on the type and magnitude of bias applied to the material composition of one or both terminals, which affect the size of the potential barrier. In the case of a junction between two semiconductor materials, the potential barrier will be formed along the interface between the two semiconductor materials.

Figure 2:
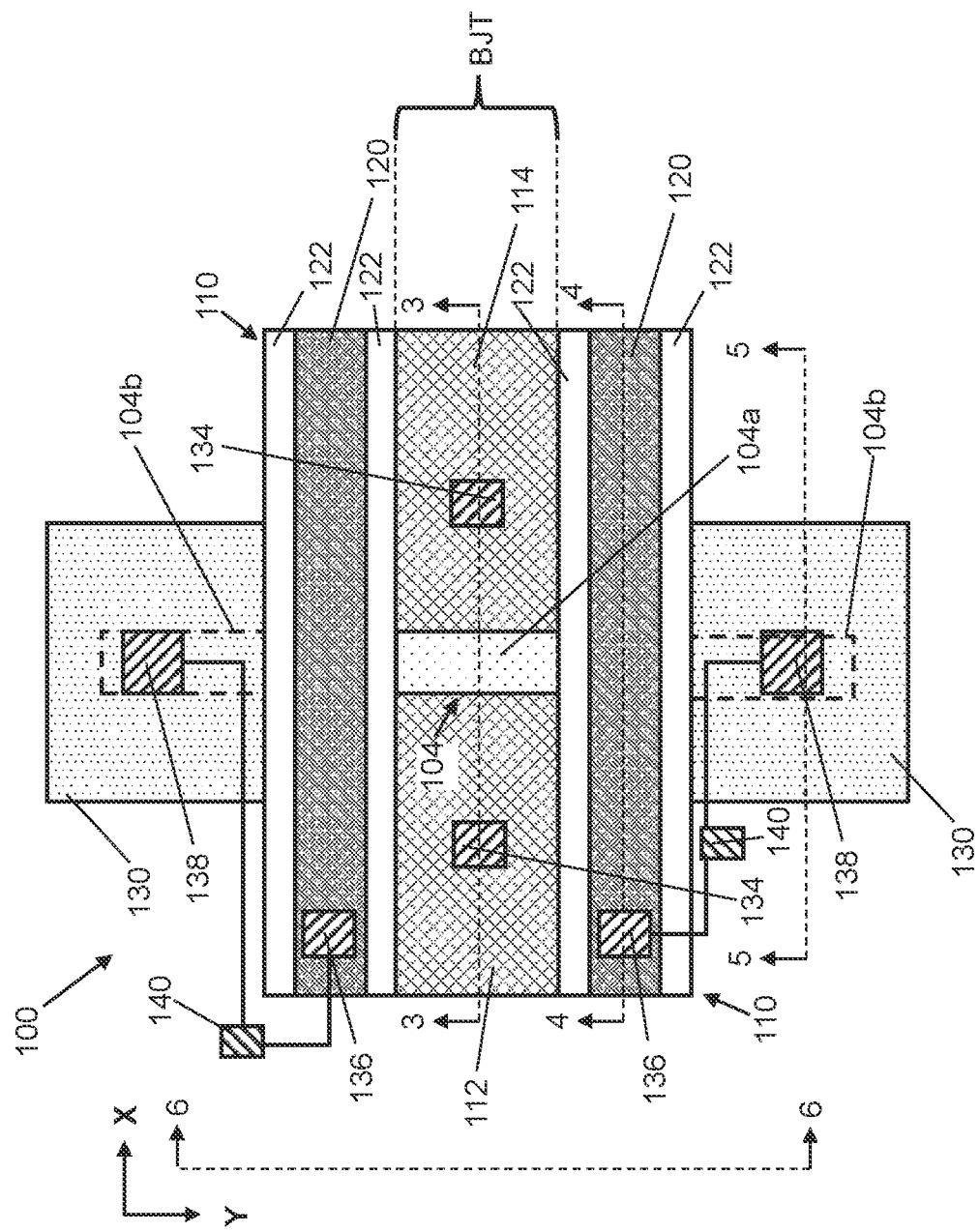
FIG. 2 shows a plan view of a structure according to embodiments of the disclosure.

FIG. 1 depicts a partial perspective view of a structure 100 according to embodiments of the disclosure. FIG. 2 depicts a plan view of structure 100 with cross hatching to further illustrate the relative position of various elements in structure 100. Structure 100 may be formed on or may include a substrate 102 including, e.g., one or more semiconductor materials. Substrate 102 may include but is not limited to silicon, germanium, silicon germanium (SiGe), silicon carbide, or any other common IC semiconductor substrates. In the case of SiGe, the germanium concentration in substrate 102 may differ from other SiGe-based structures described herein. A portion or entirety of substrate 102 may be strained.

Structure 100 may include one or more semiconductor fins 104 formed, for example, by removing selected portions of substrate 102 material to a predetermined depth. A mask (not shown) or similar material may be formed over substrate 102 at selected locations, and non-covered portions of substrate 102 and other materials formed thereon (e.g., doped semiconductor layers, pad insulator materials, etc., may be removed by etching such as a reactive ion etch (RIE)) to a predetermined depth and/or over a predetermined interval. Portions of semiconductor material may remain intact as freestanding structures as semiconductor fin(s) 104 on and above substrate 102, e.g., due to the prior masking and/or non-etching of materials in selected locations. FIG. 1 depicts portion of semiconductor fin 104b with a dashed line to indicate that it may extend further than is shown in the partial perspective view of FIG. 1.

Structure 100 may include embedded elements for electrically separating active materials formed over substrate 102, e.g., semiconductor fin(s) 104 from other regions and/or materials. An insulator layer 106 such as a trench isolation (TI) may be formed over areas of substrate 102 adjacent semiconductor fin(s) 104, e.g., by forming a layer of dielectric material (e.g., oxide or nitride insulative material), and/or other materials. A lower portion of each semiconductor fin 104 may be adjacent insulator layer 106. As examples, insulator layer 106 may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

As shown specifically in FIG. 1, portions of semiconductor fin(s) 104 may have a dielectric block 108 thereon, e.g., covering an upper surface of each semiconductor fin 104. Dielectric block 108 may include insulative materials similar to or different from insulator layer(s) 106 and may be formed to prevent additional semiconductor or conductive material formed on semiconductor fin(s) 104 from extending over the top of semiconductor fin(s) 104 to create electrical shorts and/or unintended points of contact. In some cases, dielectric block 108 may have a composition different from insulator layer(s) 106, e.g., silicon nitride (SiN) and/or other nitride-based insulators to protect dielectric block 108 from being removed when other insulative materials are removed in subsequent processing.

Semiconductor fin 104 may have distinct regions or subcomponents defining an intrinsic base region 104a and an extrinsic base region 104b of semiconductor fin 104. A gate structure 110 on semiconductor fin 104 may separate and/or be located over the boundary between intrinsic base region 104a from extrinsic base region 104b, as discussed elsewhere herein. Intrinsic base region 104a may be less highly doped than extrinsic base region 104b, e.g., to allow a stronger P-N junction to form between intrinsic base region 104a and an emitter 112 and collector 114 formed on opposing sidewalls of intrinsic base region 104a. Extrinsic base region 104b may be more highly doped to allow stronger electrical coupling to semiconductor fin 104 in extrinsic base region 104b than would be possible through intrinsic base region 104a. This also results in a lower base access resistance (R B). Extrinsic base region 104b is shown in dashed lines in FIGS. 1 and 2 to better illustrate its position below other components (e.g., upper extrinsic base material 130 discussed herein).

Figure 3:
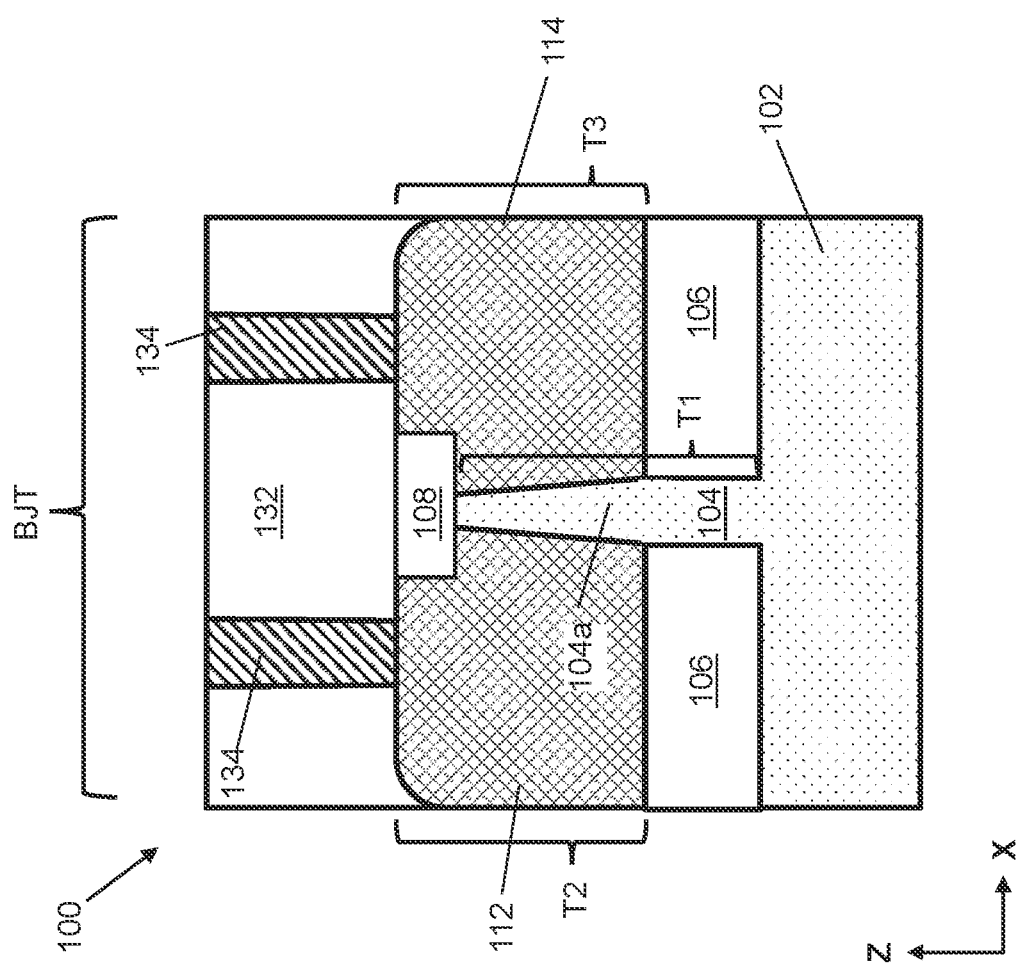
FIG. 3 shows a first cross-sectional view of a structure according to embodiments of the disclosure.

FIG. 3 provides a cross-sectional view along line 3-3 of FIG. 2. Referring to FIGS. 1-3 together, structure 100 includes emitter 112 and collector 114 layers over substrate 102, e.g., such that semiconductor fin 104 defines the base of a bipolar transistor between emitter 112 and collector 114. Emitter 112 may be adjacent one sidewall 51 of intrinsic base region 104a, while collector 114 may be adjacent a second sidewall S2 of intrinsic base region 104a. Semiconductor fin 104, emitter 112, and collector 114 may define all or part of the active bipolar materials of a bipolar transistor structure. Emitter 112 and collector 114 may be formed on respective portions of insulator layer(s) 106, e.g., by deposition or epitaxial growth of doped semiconductor material. In implementations where semiconductor fin 104 is on substrate 102 and emitter 112 and/or collector 114 are on insulator layer(s) 106, semiconductor fin 104 may have a vertical thickness T1 that is larger than a vertical thickness T2 of emitter 112 or a vertical thickness T3 of collector 114. Emitter 112 and collector 114 may include the same material composition as semiconductor fin 104 (e.g., doped SiGe or Si), but with an opposite doping type (e.g., they may be doped n-type when semiconductor fin 104 is doped p-type, or vice versa). Emitter 112 and/or collector 114 additionally or alternatively may include other electrically active semiconductor materials. Emitter 112 and/or collector 114 may be formed to a desired thickness above insulator layer(s) 106. However, dielectric block 108 in some cases may be horizontally between emitter 112 and collector 114 to prevent emitter 112 from contacting and/or merging into collector 114. Together, semiconductor fin 104 (including intrinsic base region 104a and extrinsic base region 104b thereof), emitter 112, and collector 114 define a bipolar transistor BT included within structure 100.

Figure 4:
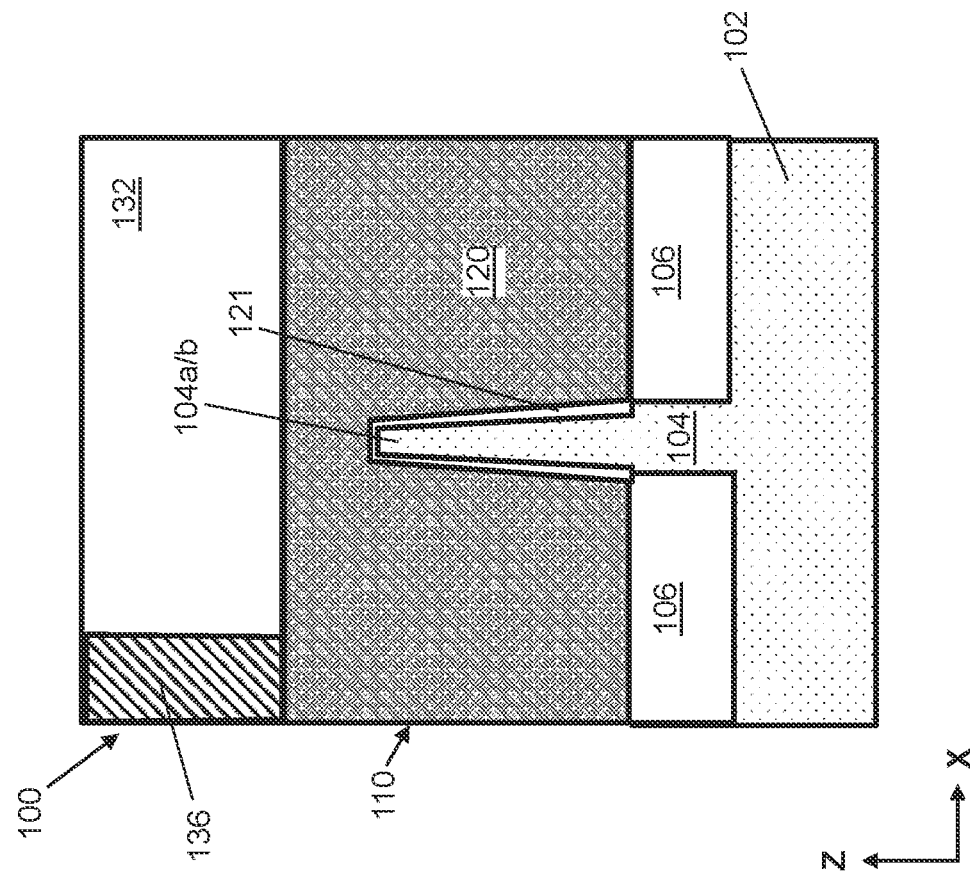
FIG. 4 shows a second cross-sectional view of a structure according to embodiments of the disclosure.

FIG. 4 provides a cross-sectional view along line 4-4 of FIG. 2. Referring to FIGS. 1, 2, and 4 together, structure 100 may include gate structure 110 over semiconductor fin 104. Gate structure 110 may be included in structure 100 to enable electrical biasing of semiconductor fin 104 thereunder. Electrically biasing semiconductor fin 104, particularly in areas where intrinsic base region 104a meets extrinsic base region 104b, may allow an operator to control the electrical resistance of intrinsic base region 104a between emitter 112 and collector 114. Similar to the operation of Metal Oxide Semiconductor Field Effect Transistor (MOSFET), electrical biasing of semiconductor material via using a gate structure may increase the conductivity of the semiconductor material. In embodiments of structure 100 however, gate structure 110 does not directly control current flow from emitter 112 to collector 114 but instead affects the ability of extrinsic base 104b to control the operation of a bipolar transistor on semiconductor fin 104. In some embodiments, gate structure 110 may be coupled to the same node as extrinsic base 104b, thereby allowing one voltage line to simultaneously lower the electrical resistance of intrinsic base 104a while causing extrinsic base 104b to enable current flow between emitter 112 and collector 114.

Gate structure 110 may be on semiconductor fin 104 such that it traverses sidewalls and an upper surface of semiconductor fin 104. Gate structure 110 may be over a boundary between intrinsic base region 104a and extrinsic base region 104b such that it overlaps both materials, or alternatively, may be over only intrinsic base region 104a or extrinsic base region 104b. Thus, gate structure 110 may be between intrinsic base region 104a and extrinsic base region 104b (e.g., along the X axis as shown). Gate structure 110 may be directly adjacent emitter 112 and collector 114 or may be spaced horizontally away from emitter 112 and collector 114 by a predetermined horizontal separation distance.

Gate structure 110 may include a gate conductor 120, e.g., any type of conductive material (e.g., such as those suitable for metal wires and contacts discussed herein) and/or other types of materials capable of being deposited over substrate 102, semiconductor fin 104, and/or insulator layer(s) 106 at selected locations. Gate conductor 120 may be formed through an independent process to form various gate structures for field effect transistors, and in some cases may initially be an electrically non-conducting or semiconductive material subsequently replaced with an electrically active component in subsequent processing, e.g., metal gate replacement. Gate structure 110 may include a layer of gate dielectric material 121 (not shown in FIGS. 1, 2, see FIG. 4) beneath gate conductor 120 to enable biasing without direct coupling of gate conductor 120 to semiconductor fin 104.

Gate structure 110 also may include spacers 122 (not shown in FIG. 4) to structurally and electrically separate base layer from adjacent electrically active materials (e.g., emitter 112, collector 114, and/or contacts formed thereto). Spacer(s) 122 may include a nitride insulative material and/or any other insulative material discussed herein, e.g., such as those for insulator layer(s) 106 or other insulating structures. Spacer(s) 122 may be formed, e.g., by depositing a corresponding spacer material such that it covers any exposed surfaces and sidewalls of gate conductor 120. In some implementations, spacer(s) 122 may include a single layer or more than two layers.

Figure 5:
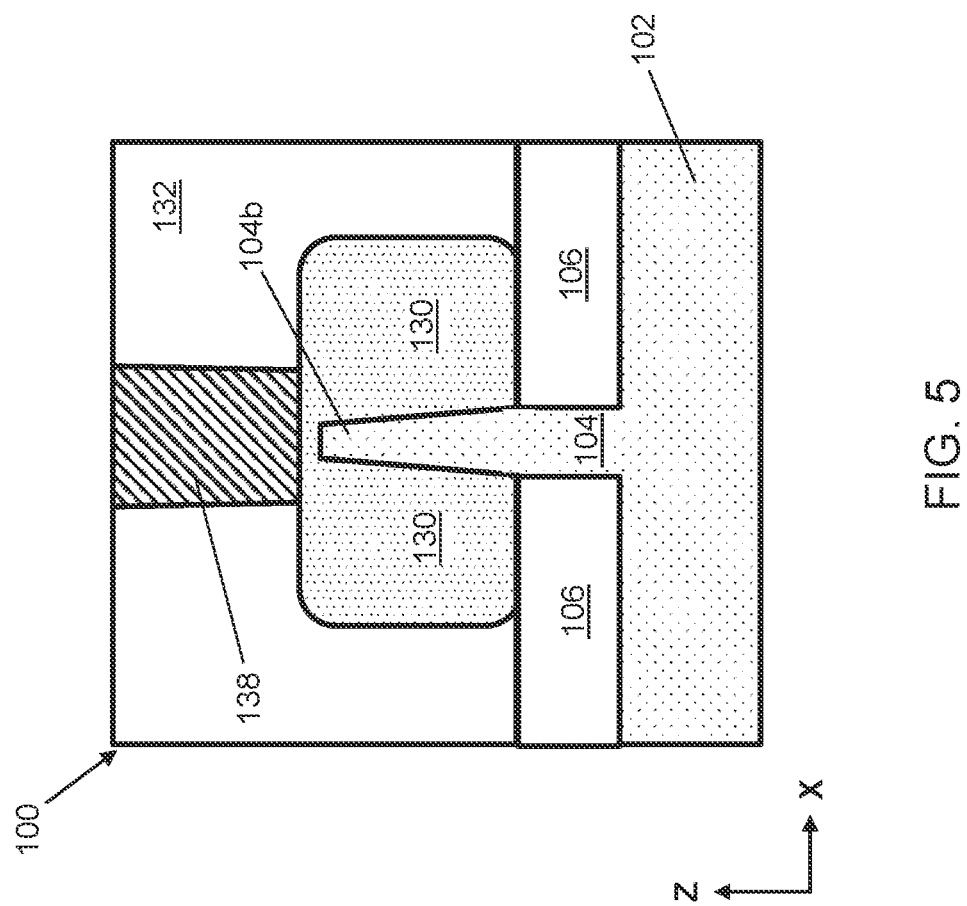
FIG. 5 shows a third cross-sectional view of a structure according to embodiments of the disclosure.

FIG. 5 provides a cross-sectional view along view line 5-5 of FIG. 2. Referring to FIGS. 1, 2, and 5, structure 100 may include an upper extrinsic base material 130 on extrinsic base region 104b of semiconductor fin. Upper extrinsic base material 130 may be formed specifically on extrinsic base region 104b of semiconductor fin 104, e.g., by covering other portions of structure 100 and implementing targeted deposition and growth of additional semiconductor materials on extrinsic base region 104b. Upper extrinsic base material 130 may provide a higher surface area and/or volume of conductive material to enhance the electrical coupling of other elements and/or materials to extrinsic base 104b. FIGS. 1 and 2 depict portions of extrinsic base 104b (in dashed lines) located beneath upper extrinsic base material 130. Upper extrinsic base material 130 may have a height above substrate 102 that is larger than emitter 112 and/or collector 114 but may not be coupled to emitter 112 or collector 114 due to the presence of gate structure 110 over semiconductor fin 104.

Structure 100 may include an inter-level dielectric (ILD) layer 132 above semiconductor fin 104, gate structure 110, emitter 112, and/or collector 114. ILD layer 132 may be formed by any appropriate deposition or other techniques of forming an insulative material on a structure. ILD layer 132, in this position also may surround the outer periphery of each element formed on or over insulator layer(s) 106. ILD layer 132 may include the same insulating material as insulator layer(s) 106 or may include a different electrically insulative material for vertically separating structure 100 from overlying materials, e.g., various horizontally extending wires or vias. ILD layer 132 and insulator layer(s) 106 nonetheless constitute different components, e.g., due to some portions of insulator layer(s) 106 being below emitter 112, collector 114, etc. When ILD layer 132 is formed, it can be planarized (e.g., using chemical mechanical polishing (CMP)), but its upper surface may remain above structure 100. ILD layer 132 may entirely cover structure 100 except in locations where conductive contacts are formed.

Figure 6:
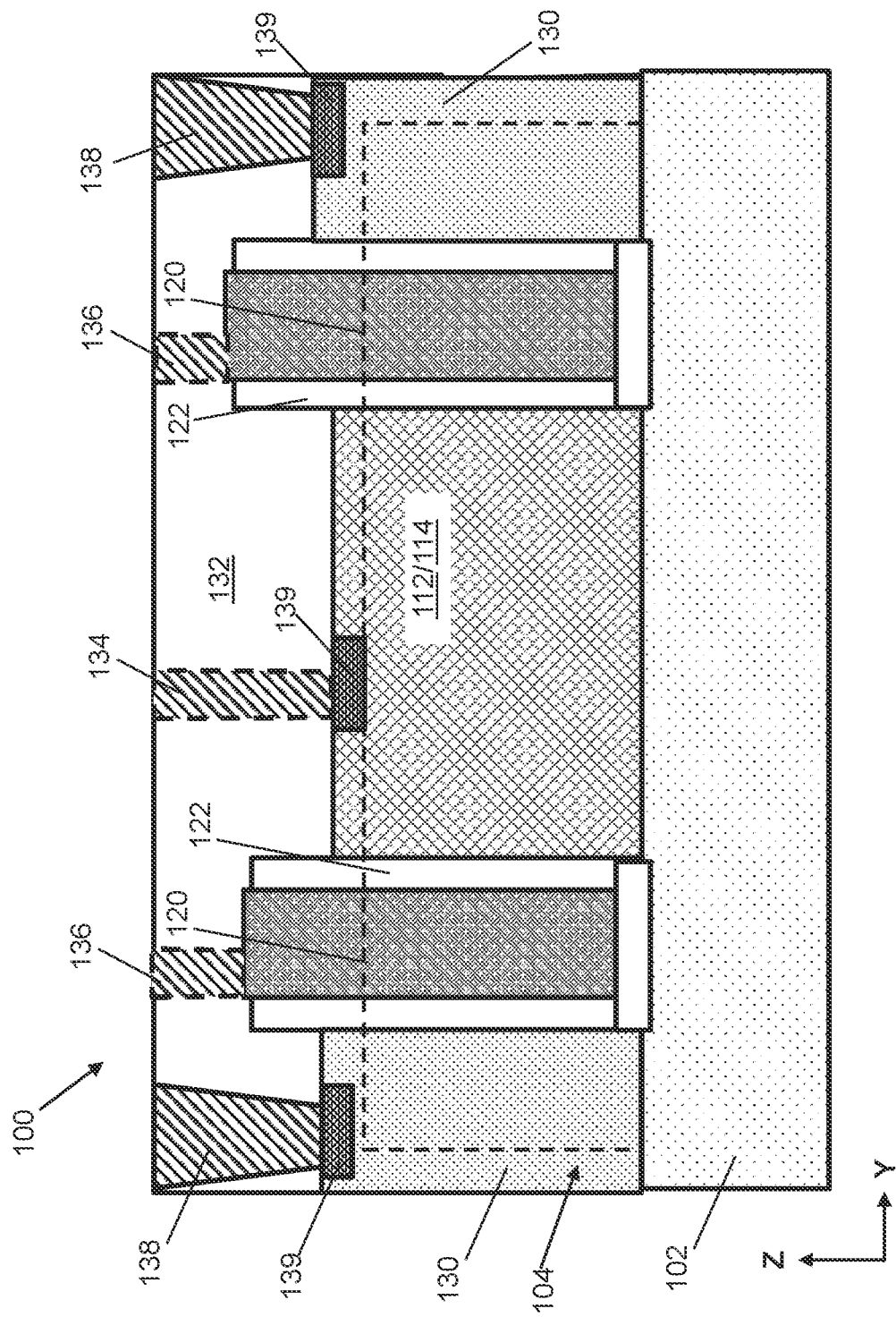
FIG. 6 shows a side view of a structure according to embodiments of the disclosure.

FIGS. 2 and 6 depict structure 100 with various components for electrical coupling to other components, e.g., metal wires and vias in overlying levels of a device. FIG. 6 provides a side view of structure 100 along view line 6-6 of FIG. 2. Structure 100 may include a set of E/C contacts 134 on emitter 112 and collector 114, and within ILD layer 132. A gate contact 136 to gate structure 110 also may be within ILD layer 132. Base contacts 138 similarly may be located on upper extrinsic base material 130 in respective positions within ILD layer 132. E/C contacts 134 and gate contacts 136 are depicted with dashed lines in FIG. 6 to indicate their position in plane Y-Z, despite contacts 134, 136 optionally having a different position along the X-axis as shown in FIG. 2. Semiconductor fin 104 is depicted with dashed lines in FIG. 6 to indicate that it may be underneath and behind the visible portions of gate structures 110, emitter 112, collector 114, and upper extrinsic base material 130. One or more of contacts 134, 136, 138 to overlying circuit elements may be formed within predetermined portions of ILD layer 132 by a controlled amount of vertical etching to form openings to one or more contact sites, and then filling the openings with a conductor. Each contact 134, 136, 138 may include any currently known or later developed conductive material configured for use in an electrical contact, e.g., tungsten (W), copper (Cu), aluminum (Al), etc. Contacts 134, 136, 138 may additionally include refractory metal liners (not shown) positioned alongside ILD layer 132 to prevent electromigration degradation, shorting to other components, etc. Additionally, silicide material(s) 139 (FIG. 6 only) may be formed on portions of emitter 112, collector 114, and/or upper extrinsic base material 130 by depositing a metal on semiconductor material thereof, annealing the metal to form silicide material 139, and removing any non-annealed metal. In cases where gate structure 110 includes a semiconductor material on or in place of gate conductor 120, silicide material 139 alternatively may be formed below gate contact 136.

Referring solely to FIG. 2, gate structure 110 is operable to control the resistance between intrinsic base region 104a and extrinsic base region 104b of semiconductor fin 104. In some cases, it may be desirable to electrically bias extrinsic base region 104b while simultaneously controlling the electrical resistance within semiconductor fin 104. To provide such functionality, structure 100 may include a shared node 140 (e.g., an overlying metal wire, via, and/or other conductive material) coupled to gate contact 136 and base contact 138. In this manner, one voltage may be applied simultaneously to upper extrinsic base material 130 and gate structure 110. The coupling between shared node 140 to contacts 136, 138 may be implemented in any conceivable manner, e.g., by shared node 140 being a single metal wire coupled to each contact 136, 138 to form a parallel connection.

Figure 7:
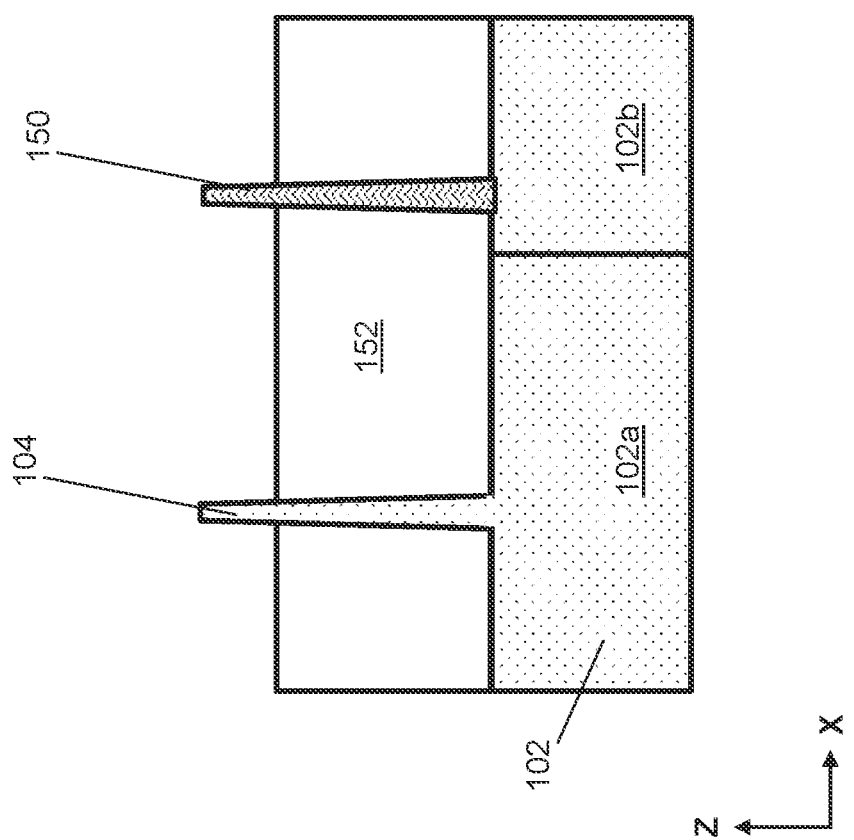
FIGS. 7-10 depict processes to form a structure according to embodiments of the disclosure.

Referring now to FIG. 7, methods of the disclosure allow structure 100 to be integrated into existing processes to form other types of transistors, e.g., complementary metal oxide semiconductor (CMOS) devices on substrate 102. Substrate 102 may be subdivided into distinct regions, e.g., based on the types of device(s) formed thereon. In an example, substrate 102 may include a first region 102a on which structure 100 (FIGS. 1-6) is formed. Semiconductor fin 104 may be on first region 102a, whereas a CMOS semiconductor fin 150 may be on second region 102b. CMOS semiconductor fin 150 may have a different doping type and/or material composition from semiconductor fin 104. In other implementations, CMOS semiconductor fin 150 initially may be indistinct from semiconductor fin 104. Methods of the disclosure may include forming a dielectric layer 152 over substrate 102, in which a height of dielectric layer 152 over substrate 102 is less than a height of semiconductor fins 104, 150 over substrate 102. Thus, an uppermost portion of fins 104, 150 may be above dielectric layer 152. Dielectric layer 152 may include, e.g., one or more oxide insulators and/or other insulative materials discussed herein. The height of dielectric layer 152 over substrate 102 may be controlled by a combination of deposition and etching as generally known in the art.

Figure 8:
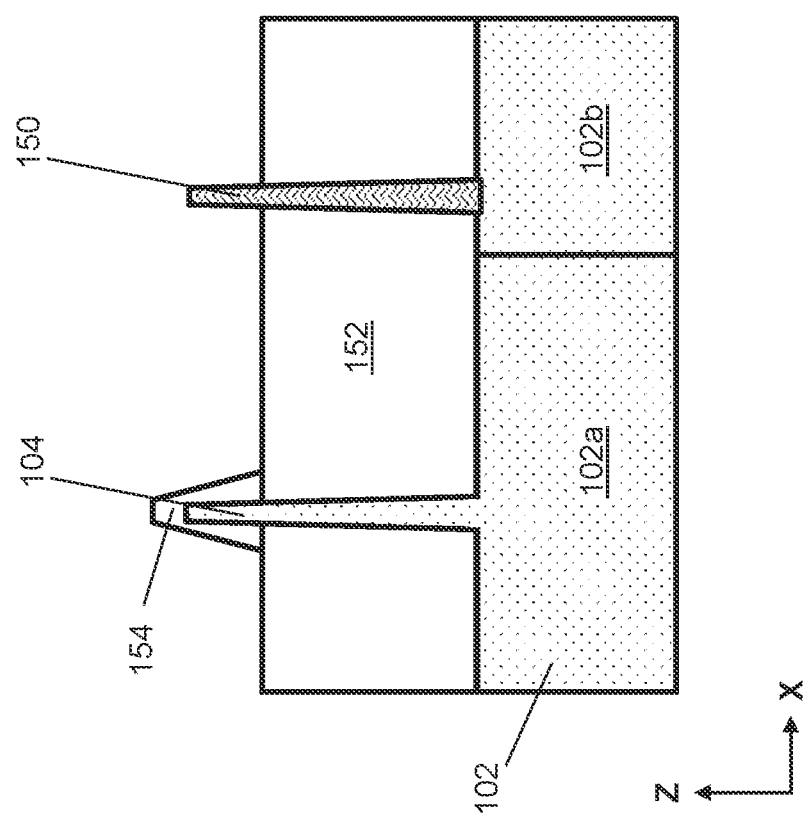

Turning to FIG. 8, methods of the disclosure may include forming an insulative cap 154 on semiconductor fin 104, without forming a similar material on CMOS semiconductor fin 150. Insulative cap 154 may have a different composition from that of dielectric layer 152, e.g., it may include a nitride insulator in the case where dielectric layer 152 includes oxide or vice versa. Initially insulative cap 154 may be deposited over fins 104, 150 and dielectric layer 152 as a single layer before being targeted and removed from all structures other than semiconductor fin 104 and adjacent portions of dielectric layer 152.

Figure 9:
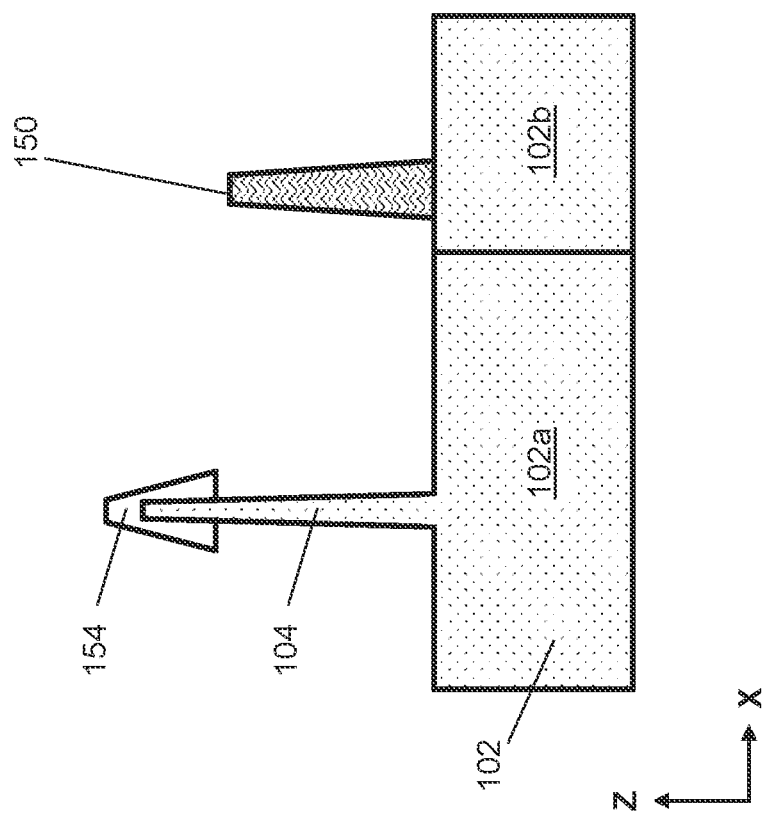

FIG. 9 depicts continued processing by selectively removing dielectric layer 152 while leaving insulative cap 154 intact over semiconductor fin 104. The removing of dielectric layer 152 may include, e.g., selective etching and/or other targeted removal of dielectric layer 152 material without affecting insulative cap 154. Such processes may include, e.g., wet etching of oxide with a material that does not significantly affect nitride insulators. At this stage, insulative cap 154 remains intact on the uppermost portions of semiconductor fin 104 but does not contact any portion of CMOS semiconductor fin 150. In addition, methods of the disclosure may include decreasing the height of CMOS semiconductor fin 150, e.g., by etching of semiconductor materials such that CMOS semiconductor fin 150 is shorter than semiconductor fin 104. Insulative cap 154 may protect semiconductor fin 104 from being etched at the same time as CMOS semiconductor fin 150. In this configuration, separate emitter and collector terminals can be formed on semiconductor fin 104 without contacting each other due to the presence of insulative cap 154. However, epitaxial semiconductor material may be formed simultaneously on CMOS semiconductor fin 150 substantially according to conventional techniques to form a FinFET transistor.

Figure 10:
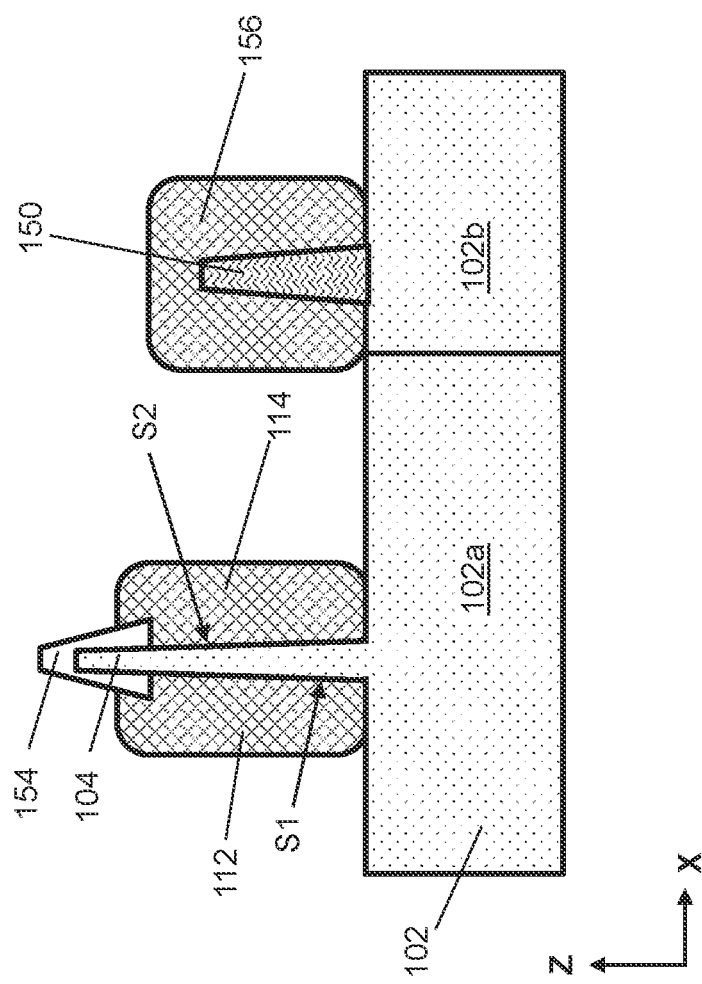

FIG. 10 depicts forming emitter 112 and collector 114 on opposite sidewalls S1, S2 of semiconductor fin 104 while also forming a source/drain (S/D) material 156 on CMOS semiconductor fin 150. Emitter 112 and collector 114 may be formed simultaneously on semiconductor fin 104, e.g., by epitaxially growing doped semiconductor material on sidewalls S1, S2 of semiconductor fin 104. The presence of insulative cap 154 on semiconductor fin 104 prevents emitter 112 and collector 114 from merging into a single region of semiconductor material. By contrast, the same instance of epitaxial growth may form S/D material 156 on CMOS semiconductor fin 150. Since CMOS semiconductor fin 150 does not include insulative cap 154 thereon, S/D material 156 may be a single layer contacting the sidewalls and upper surface of CMOS semiconductor fin 150. At this stage of processing, insulative cap 154 may be partially removed or kept in place to create dielectric block 108 (FIGS. 1, 3) over semiconductor fin 104. Further processing may include, e.g., forming gate structure(s) 110 over fins 104, 150 to define a gate terminal over second region 102b of substrate 102 while simultaneously creating structures to control the electrical resistance between extrinsic base regions 104a, 104b of semiconductor fin 104. Still further processing may include, e.g., forming upper extrinsic base material 130 (FIGS. 1, 2, 5, 6) on extrinsic base region 104b of semiconductor fin 104. These and other processes may be implemented substantially as known in the art after semiconductor fin 104, emitter 112, collector 114, and insulative cap 154 have been formed as discussed herein.

Embodiments of the disclosure provide various technical and commercial advantages, examples of which are discussed herein. Embodiments of the disclosure enable active control over the electrical resistance between the extrinsic base and intrinsic base of a bipolar transistor formed on a semiconductor fin 104, e.g., by forming a gate structure on the semiconductor fin. By preparing semiconductor fin 104 for emitter and base formation (e.g., by forming dielectric block 108 as discussed herein), emitter 112 and collector 114 can be formed on semiconductor fin 104 without merging into a single region of semiconductor material. Gate structure 110 thus can be formed on semiconductor fin 104 adjacent emitter 112 and collector 114, while also being adjacent upper extrinsic base material 130. During operation, active control over the base resistance in structure 100 reduces access resistance when operating a bipolar transistor within structure 100. These and other benefits may be enhanced, e.g., by coupling shared node 140 (FIG. 2) to gate structure 110 and upper extrinsic base material 130 as discussed herein.

The method and structure as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a center processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure comprising:
   a semiconductor fin including an intrinsic base region and an extrinsic base region adjacent the intrinsic base region along a length of the semiconductor fin;
   a collector adjacent a first sidewall of the intrinsic base region along a width of the semiconductor fin;
   an emitter adjacent a second sidewall of the intrinsic base region along the width of the semiconductor fin;
   a gate structure on the semiconductor fin, and between the intrinsic base region and the extrinsic base region; and
   a dielectric block on the intrinsic base region of the semiconductor fin, and horizontally between and contacting the emitter and the collector.

2. The structure of claim 1, wherein the gate structure extends over the semiconductor fin and is horizontally adjacent the collector and the emitter.

3. The structure of claim 2, wherein the gate structure includes a gate conductor adjacent a spacer, and the spacer horizontally separates the gate conductor from the collector and the emitter.

4. The structure of claim 1, further comprising an upper extrinsic base material over the extrinsic base region of the semiconductor fin, wherein a width of the upper extrinsic base material is larger than a width of the intrinsic base region of the semiconductor fin.

5. The structure of claim 4, wherein the gate structure horizontally separates the upper extrinsic base material from the emitter and the collector of the bipolar transistor.

6. The structure of claim 1, wherein a vertical thickness of the semiconductor fin is larger than a vertical thickness of the emitter and a vertical thickness of the collector.

7. A structure comprising:
   a semiconductor fin over a substrate, the semiconductor fin including:
      an intrinsic base region within a first portion of the semiconductor fin, and
      an extrinsic base region within a second portion of the semiconductor fin;
   an emitter adjacent a first sidewall of the intrinsic base region of the semiconductor fin along a width of the semiconductor fin;
   a collector adjacent a second sidewall of the intrinsic base region of the semiconductor fin along the width of the semiconductor fin, wherein the intrinsic base region of the semiconductor fin is horizontally between the emitter and the collector;

a gate structure on the semiconductor fin;

a gate contact to the gate structure;

a base contact to the extrinsic base region of the semiconductor fin; and a dielectric block on the intrinsic base region of the semiconductor fin, and horizontally between and contacting the emitter and the collector.

8. The structure of claim 7, wherein the gate structure includes a gate conductor adjacent a spacer, and the spacer horizontally separates the gate conductor from the collector and the emitter.

9. The structure of claim 7, further comprising an upper extrinsic base material over the extrinsic base region of the semiconductor fin, wherein a width of the upper extrinsic base material is larger than a width of the intrinsic base region of the semiconductor fin.

10. The structure of claim 9, wherein the gate structure horizontally separates the upper extrinsic base material from the emitter and the collector of the bipolar transistor.

11. The structure of claim 7, wherein the base contact is coupled to the gate contact.

12. The structure of claim 7, further comprising a shallow trench isolation (STI) adjacent a lower portion of the semiconductor fin, vertically between the substrate and one of the collector and the emitter.

13. A method comprising:

forming a semiconductor fin including an intrinsic base region and an extrinsic base region adjacent the intrinsic base region along a length of the semiconductor fin;

forming a bipolar transistor including the intrinsic base region of the semiconductor fin horizontally between an emitter and a collector along a width of the semiconductor fin;

forming a gate structure on the semiconductor fin, and between the intrinsic base region and the extrinsic base region; and forming a dielectric block on the intrinsic base region of the semiconductor fin, and horizontally between and contacting the emitter and the collector.

14. The method of claim 13, wherein the gate structure extends over the semiconductor fin and is horizontally adjacent the collector and the emitter.

15. The method of claim 13, wherein forming the gate structure includes forming a gate conductor on the semiconductor fin and forming a spacer adjacent the gate conductor, wherein the spacer horizontally separates the gate conductor from the collector and the emitter.

16. The method of claim 13, further comprising forming an upper extrinsic base over the extrinsic base region of the semiconductor fin, wherein a width of the upper extrinsic base is larger than a width of the intrinsic base region of the semiconductor fin.

17. The method of claim 16, wherein the gate structure horizontally separates the upper extrinsic base from the emitter and the collector of the bipolar transistor.

18. The method of claim 13, further comprising electrically coupling the gate structure to the extrinsic base region.

* * * * *